(12) United States Patent
Lee et al.

(10) Patent No.: US 11,775,092 B2
(45) Date of Patent: *Oct. 3, 2023

(54) CAPACITIVE POINTING STICK ASSEMBLY WITH PRESENCE DETECTION

(71) Applicant: Synaptics Incorporated, San Jose, CA (US)

(72) Inventors: Wei-Lung Lee, Taipei (TW); Chih-Chien Chou, Taoyuan (TW); Lin-Hsiang Hsieh, Taoyuan (TW)

(73) Assignee: Synaptics Incorporated, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/169,710

(22) Filed: Feb. 15, 2023

(65) Prior Publication Data
US 2023/0195247 A1    Jun. 22, 2023

Related U.S. Application Data

(63) Continuation of application No. 17/490,330, filed on Sep. 30, 2021, now Pat. No. 11,614,813.

(51) Int. Cl.
| G06F 3/038 | (2013.01) |
| G06F 3/0338 | (2013.01) |
| G06F 3/044 | (2006.01) |
| H05K 1/02 | (2006.01) |

(52) U.S. Cl.
CPC .......... *G06F 3/0383* (2013.01); *G06F 3/0338* (2013.01); *G06F 3/044* (2013.01); *H05K 1/028* (2013.01); *H05K 2201/10151* (2013.01)

(58) Field of Classification Search
CPC ...... G06F 3/0383; G06F 3/0338; G06F 3/044; H05K 1/028; H05K 2201/10151
See application file for complete search history.

(56) References Cited

U.S. PATENT DOCUMENTS

| 9,354,720 B1* | 5/2016 | Hsieh | G06F 3/0416 |
| 2014/0267134 A1* | 9/2014 | Bulea | G06F 3/04166 |
| | | | 345/174 |
| 2017/0336904 A1* | 11/2017 | Hsieh | G06F 3/0412 |

* cited by examiner

*Primary Examiner* — Sahlu Okebato
(74) *Attorney, Agent, or Firm* — Leydig, Voit & Mayer, Ltd.

(57) ABSTRACT

A pointing stick assembly includes: a head having a top surface configured to interface with a finger; a shaft connected to the head, wherein the shaft configured to be moved downward based on a finger pressing down on the head and to be tilted based on a finger tilting the head; a first sensor layer comprising a receiver electrode and a transmitter electrode; a second sensor layer comprising a transmitter electrode; and a third sensor layer comprising a plurality of receiver electrodes. The first sensor layer is configured for detection of presence of a finger based on a change in capacitance between the receiver electrode and the transmitter electrode of the first sensor layer caused by the presence of the finger on the top surface of the head.

20 Claims, 10 Drawing Sheets

CAPACITIVE POINTING STICK ASSEMBLY WITH PRESENCE DETECTION

CROSS-REFERENCE TO RELATED APPLICATIONS

This patent application is a continuation of copending U.S. patent application Ser. No. 17/490,330, filed Sep. 30, 2021, the entirety of which is incorporated by reference herein.

BACKGROUND

Input devices including proximity sensor devices (also commonly called touchpads or touch sensor devices) and pointing sticks are widely used in a variety of electronic systems.

A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones and tablet computers). Such touch screen input devices are typically superimposed upon or otherwise collocated with a display of the electronic device.

Pointing sticks are also integrated in many small computing systems, some of which also include a proximity sensor device. Capacitive technology may be used to implement pointing sticks, whereby a downward pressing force or a tilting force applied to a pointing stick may be detected based on changes in capacitance between a transmitter electrode and one or more receiver electrodes. The change in capacitance may correspond to a change of distance between a transmitter electrode layer and a receiver electrode layer caused by the downward pressing force and/or the tilting force which compresses at least a portion of a spacer layer. Through the use of multiple receiver electrodes, a direction associated with the downward pressing force and/or the tilting force may also be determined based on the respective changes in capacitance (or lack thereof) detected via respective receiver electrodes.

SUMMARY

In an exemplary embodiment, the disclosure provides a system, wherein the system includes a pointing stick assembly and a processing system coupled to the pointing stick assembly. The pointing stick assembly includes: a top surface configured to interface with a finger; a first sensor layer comprising a receiver electrode and a transmitter electrode; a second sensor layer comprising a transmitter electrode; and a third sensor layer comprising a plurality of receiver electrodes. The processing system is configured to: drive the transmitter electrode of the first sensor layer of the pointing stick assembly with first sensing signals for presence detection; determine whether or not a finger is present on the top surface of the pointing stick assembly based on first resulting signals obtained via the receiver electrode of the first sensor layer of the pointing stick assembly in response to the first sensing signals; and drive the transmitter electrode of the second sensor layer with second sensing signals for navigation detection. The first sensor layer of the pointing stick assembly is closer to the top surface of the pointing stick assembly than the second and third sensor layers of the pointing stick assembly.

The processing system may be further configured to turn on navigation detection in response to detecting that a finger is present on the top surface of the pointing stick assembly and to turn off navigation detection in response to detecting that a finger is not present on the top surface of the pointing stick assembly.

The processing system may be further configured to detect a pressing operation and/or a tilting operation performed on the pointing stick assembly by a finger based on second resulting signals obtained via the plurality of receiver electrodes of the third sensor layer of the pointing stick assembly in response to the second sensing signals.

The processing system may be further configured to register a single tap or a double tap gesture based on the first resulting signals obtained via the receiver electrode of the first sensor layer of the pointing stick assembly.

The transmitter electrode of the first sensor layer may be connected to the transmitter electrode of the second sensor layer, and the processing system may be configured to drive the transmitter electrode of the first sensor layer and the transmitter electrode of the second sensor layer together as a single transmitter channel.

The third sensor layer may include at least four receiver electrodes.

The second sensor layer and the third sensor layer may be part of a single flexible printed circuit (FPC), wherein the FPC includes a first fold between the second sensor layer and the third sensor layer. Further, the first sensor layer may also be a part of the FPC, wherein the FPC includes a second fold between the first sensor layer and the second sensor layer.

The second sensor layer may be disposed between the first sensor layer and the third sensor layer.

The pointing stick assembly and the processing system may be part of a laptop computer.

In another exemplary embodiment, the disclosure provides a pointing stick assembly. The pointing stick assembly includes: a head having a top surface configured to interface with a finger; a shaft connected to the head, wherein the shaft configured to be moved downward based on a finger pressing down on the head and to be tilted based on a finger tilting the head; a first sensor layer comprising a receiver electrode and a transmitter electrode; a second sensor layer comprising a transmitter electrode; and a third sensor layer comprising a plurality of receiver electrodes. The first sensor layer is configured for detection of presence of a finger based on a change in capacitance between the receiver electrode and the transmitter electrode of the first sensor layer caused by the presence of the finger on the top surface of the head. The second and third sensor layers are configured for detection of pressing and tilting operations performed on the head based on changes in capacitance between the transmitter electrode of the second sensor layer and the plurality of receiver electrodes of the third sensor layer caused by corresponding changes in distance between the transmitter electrode of the second sensor layer and the plurality of receiver electrodes of the third sensor layer.

The transmitter electrode of the first sensor layer may be connected to the transmitter electrode of the second sensor layer.

The third sensor layer may include at least four receiver electrodes.

The second sensor layer and the third sensor layer may be part of a single flexible printed circuit (FPC), wherein the FPC includes a first fold between the second sensor layer and the third sensor layer. Further, the first sensor layer may also be a part of the FPC, wherein the FPC includes a second fold between the first sensor layer and the second sensor layer.

The second sensor layer may be disposed between the first sensor layer and the third sensor layer.

The pointing stick assembly may be part of a laptop computer.

In yet another exemplary embodiment, the disclosure provides a method for operating a pointing stick assembly. The method includes: driving, by a processing system, a transmitter electrode of a first sensor layer of the pointing stick assembly; obtaining, by the processing system, first resulting signals via a receiver electrode of the first sensor layer of the pointing stick assembly based on driving the transmitter electrode of the first sensor layer of the pointing stick assembly; detecting, by the processing system, based on the first resulting signals, that a finger is present on the pointing stick assembly; driving, by the processing system, a transmitter electrode of a second sensor layer of the pointing stick assembly; obtaining, by the processing system, second resulting signals via a plurality of receiver electrodes of a third sensor layer of the pointing stick assembly based on driving the transmitter electrode of the second sensor layer of the pointing stick assembly; and detecting, by the processing system, based on the second resulting signals, a pressing operation and/or a tilting operation performed on the pointing stick assembly by the finger.

The method may further include: turning on navigation detection in response to detecting that a finger is present on the top surface of the pointing stick assembly; and turning off navigation detection in response to detecting that a finger is not present on the top surface of the pointing stick assembly.

The method may further include: registering a single tap or a double tap gesture based on the first resulting signals obtained via the receiver electrode of the first sensor layer of the pointing stick assembly.

The transmitter electrode of the first sensor layer may be connected to the transmitter electrode of the second sensor layer, and the transmitter electrode of the first sensor layer and the transmitter electrode of the second sensor layer may be driven together as a single transmitter channel.

DETAILED DESCRIPTION

The following detailed description is exemplary in nature and is not intended to limit the disclosure or the application and uses of the disclosure. Furthermore, there is no intention to be bound by any expressed or implied theory presented in the preceding background, summary, and brief description of the drawings, or the following detailed description.

Conventional capacitive pointing sticks are not able to detect whether or not a user's finger is in contact with the pointing stick until after the user has pressed down on and/or tilted the pointing stick. Exemplary embodiments of the present disclosure, however, provide a capacitive pointing stick assembly capable of detecting the presence of a user's finger on top of the pointing stick even when the user has merely placed a finger onto the pointing stick without having pressed down on or tilted it or when the user has merely applied a very light force onto the pointing stick. Additionally, the structure and configuration of the capacitive pointing stick assembly in exemplary embodiments of the present disclosure is compatible with conventional capacitive pointing stick assemblies, such that a complicated or expensive retooling and redesign of the pointing stick structure and the electronic device structure is not needed to achieve the improved functionality provided in exemplary embodiments of the present disclosure.

The capability of detecting the presence of a user's finger on top of the pointing stick allows for various advantages to be achieved. For example, this capability may be used to solve the problem of pointing stick drift by turning off the navigation functionality associated with the pointing stick when no finger is present. Additionally, this capability may be used to provide for a wake-up operation to turn on the pointing stick's navigational capabilities in response to the pointing stick being woken up in response to the presence of a user's finger. This capability may also provide for additional ways to use the pointing stick for user input detection, such as enabling the detection of tapping gestures on the pointing stick where the user taps a finger onto the pointing stick one or more times with only a light amount of force.

Figure 1:
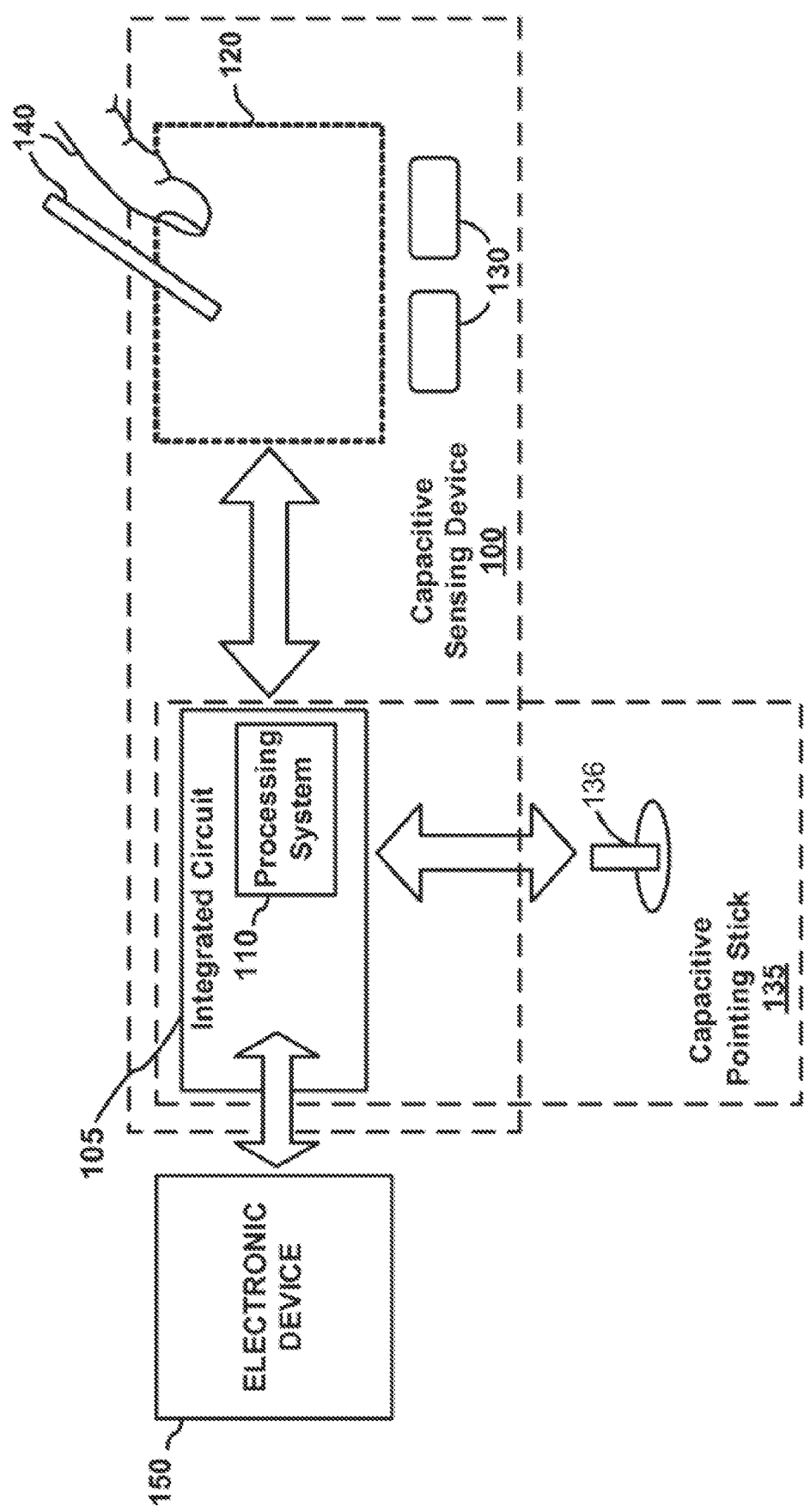
FIG. 1 is a schematic block diagram of an exemplary device having both a touch sensor and a pointing stick.

Turning now to the figures, FIG. 1 is a block diagram of an example device having an input device 100 and capacitive pointing stick 135 coupled with a single integrated circuit. It will be appreciated that the environment depicted in FIG. 1 is merely an example, and that embodiments of the present disclosure are not limited thereto and may be implemented in other types of devices having other configurations. For example, instead of having a single integrated circuit shared by input device 100 and capacitive pointing stick 135, each of input device 100 and capacitive pointing stick 135 may have its own respective circuitry associated therewith. Additionally, in some embodiments, a device may include a pointing stick (e.g., capacitive pointing stick 135) without including a capacitive proximity sensing device (e.g., input device 100).

Input device 100 may be a capacitive proximity sensing device, and capacitive pointing stick 135 may utilize a capacitive pointing stick circuit 136 for receiving user input. In this example, both share a processing system 110 that is disposed on a single integrated circuit (alternatively, they may have multiple processing systems and multiple integrated circuits). Processing system 110 may be used for sensing input from both capacitive pointing stick circuit 136 and from sensing region 120 of capacitive input device 100. Both input device 100 and capacitive pointing stick 135 may be configured to provide input to an electronic device 150. As used in this document, the term "electronic device" (or "electronic system") broadly refers to any device/system capable of electronically processing information. Some non-limiting examples of electronic devices/systems include personal computers of all sizes and shapes, such as desktop computers, laptop computers, netbook computers, tablets, web browsers, e-book readers, and personal digital assistants (PDAs). Additional example electronic devices/systems include composite input devices, such as physical keyboards that include input device 100 and/or capacitive pointing stick 135 and/or separate joysticks or key switches. Further example electronic devices/systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic device/system could be a host or a slave to the input device.

Input device 100 and capacitive pointing stick 135 can be implemented as a physical part of the electronic device/system, or can be physically separate from the electronic device/system. As appropriate, input device 100 and capacitive pointing stick 135 may communicate with parts of the electronic device/system using any one or more of the following: buses, networks, and other wired or wireless interconnections. Examples include, but are not limited to: Inter-Integrated Circuit (I2C), Serial Peripheral Interface (SPI), Personal System 2 (PS/2), Universal Serial Bus (USB), Bluetooth®, Radio Frequency (RF), and Infrared Data Association (IrDA).

In FIG. 1, input device 100 is shown as a capacitive proximity sensor device (also often referred to as a "touchpad" or a "touch sensor device") configured to sense input provided by one or more input objects 140 in a sensing region 120. Example input objects include fingers and styli, as shown in FIG. 1.

Sensing region 120 encompasses any space above, around, in and/or near input device 100 in which input device 100 is able to detect user input (e.g., user input provided by one or more input objects 140). The sizes, shapes, and locations of particular sensing regions may vary widely from embodiment to embodiment. In some embodiments, sensing region 120 extends from a surface of input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of input device 100, contact with an input surface (e.g., a touch surface) of input device 100, contact with an input surface of input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, sensing region 120 has a rectangular shape when projected onto an input surface of input device 100.

Input device 100 may utilize any combination of sensor components and sensing technologies to detect user input in sensing region 120. Input device 100 comprises one or more sensing elements for detecting user input. As a non-limiting example, input device 100 may use capacitive techniques.

Some implementations of input device 100 are configured to provide images that span one, two, three, or higher dimensional spaces. Some implementations are configured to provide projections of input along particular axes or planes.

In some capacitive implementations of input device 100, voltage or current is applied to create an electric field. Nearby input objects cause changes in the electric field, and produce detectable changes in capacitive coupling that may be detected as changes in voltage, current, or the like.

Some capacitive implementations of input device 100 utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations of input device 100 utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g., system ground), and by detecting the capacitive coupling between the sensor electrodes and input objects.

Some capacitive implementations of input device 100 utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Collectively transmitters and receivers may be referred to as sensor electrodes or sensor elements. Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g., other electromagnetic signals). Sensor electrodes may be dedicated transmitters or receivers, or may be configured to both transmit and receive. In some embodiments, one or more receiver electrodes may be operated to receive a resulting signal when no transmitter electrodes are transmitting (e.g., the transmitters are disabled). In this manner, the resulting signal represents noise detected in the operating environment of sensing region 120.

In FIG. 1, a processing system 110 is shown as part of input device 100. Processing system 110 may also, at the same time be a part of capacitive pointing stick 135. Processing system 110 is configured to operate the hardware of input device 100 to detect input in sensing region 120. Processing system 110 comprises a variety of circuitry components associated with input device 100, that are disposed as a portion of a single integrated circuit 105. For example, a processing system 110 for a mutual capacitance sensor device may comprise transmitter circuitry configured to transmit signals with transmitter sensor electrodes, and/or receiver circuitry configured to receive signals with receiver sensor electrodes. As described herein, the same transmitter and receiver circuitry features of processing system 110 are additionally purposed for use in transmitting signals to and receiving signals from capacitive elements of capacitive pointing stick 135. In some embodiments, processing system 110 also comprises electronically-readable instructions, such as firmware code, software code, and/or the like. As one example, input device 100 and capacitive pointing stick 135 may be physically integrated in a phone, and processing system 110 may comprise circuits and firmware that are part of a main processor of the phone. In some embodiments, processing system 110 is dedicated to implementing input device 100 or capacitive pointing stick 135, even though capable of and configured to implement both. In other embodiments, processing system 110 also performs other functions, such as operating display screens, driving haptic actuators, etc.

Processing system 110 may be implemented as a set of modules that handle different functions of processing system 110. Each module may comprise circuitry that is a part of processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, processing system 110 responds to user input (or lack of user input) in sensing region 120, of input device 100 and capacitive pointing stick 135 by directly causing one or more actions. Example actions include changing operation modes, as well as graphical user interface (GUI) actions such as cursor movement, selection, menu navigation, and other functions. In some embodiments, processing system 110 provides information about the input (or lack of input) to some part of the electronic system (e.g., to a central processing system of the electronic system that is separate from processing system 110, if such a separate central processing system exists). In some embodiments, some part of the electronic system processes information received from processing system 110 to act on user input, such as to facilitate a full range of actions, including mode changing actions and GUI actions.

For example, in some embodiments, processing system 110 operates the sensing element(s) of input device 100 to produce electrical signals indicative of input (or lack of input) in sensing region 120 and/or operates the capacitive elements of capacitive pointing stick 135 to produced electrical signals indicative of input (or lack of input) with respect to capacitive pointing stick circuit 136. Processing system 110 may perform any appropriate amount of processing on the electrical signals in producing the information provided to the electronic device/system. For example, processing system 110 may digitize analog electrical signals obtained from the sensor electrodes of a capacitive sensor or from the capacitive elements of capacitive pointing stick circuit 136. As another example, processing system 110 may perform filtering or other signal conditioning. As yet another example, processing system 110 may subtract or otherwise account for a baseline, such that the information reflects a difference between the electrical signals received from input device 100 or capacitive pointing stick 135 and the baseline. As yet further examples, processing system 110 may determine positional information, recognize inputs as commands, recognize handwriting, and the like.

"Positional information" as used herein with respect to input device 100 and capacitive pointing stick 135 broadly encompasses interpretation of absolute position, relative position, velocity, acceleration, and other types of spatial information from inputs received from input device 100 and/or capacitive pointing stick 135. Exemplary "zero-dimensional" positional information includes near/far or contact/no contact information, with respect to input device 100. Exemplary "one-dimensional" positional information includes positions along an axis, with respect to input device 100. Exemplary "two-dimensional" positional information includes motions in a plane, with respect to input device 100. Exemplary "three-dimensional" positional information includes instantaneous or average velocities in space, with respect to input device 100. Further examples include other representations of spatial information. Historical data regarding one or more types of positional information may also be determined and/or stored, including, for example, historical data that tracks position, motion, or instantaneous velocity over time.

In some embodiments, input device 100 is implemented with additional input components that are operated by processing system 110 or by some other processing system. These additional input components may provide redundant functionality for input in sensing region 120, or some other functionality. FIG. 1 shows buttons 130 near sensing region 120 that can be used to facilitate selection of items using input device 100. Other types of additional input components include sliders, balls, wheels, switches, and the like. Conversely, in some embodiments, input device 100 may be implemented with no other input components. Similarly, capacitive pointing stick 135 may be implemented with or without other input components, such as buttons, sliders, balls, wheels, switches, and the like.

In some embodiments, input device 100 may be a touch screen, and sensing region 120 overlaps at least part of an active area of a display screen. For example, input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. Input device 100 and the display screen may share physical elements. For example, some embodiments may utilize some of the same electrical components for displaying and sensing. As another example, the display screen may be operated in part or in total by processing system 110.

It should be understood that while many embodiments are described in the context of a fully functioning apparatus, the mechanisms are capable of being distributed as a program product (e.g., software) in a variety of forms. For example, the mechanisms that are described may be implemented and distributed as a software program on information bearing media that are readable by electronic processors (e.g., non-transitory computer-readable and/or recordable/writable information bearing media readable by processing system 110). Additionally, the embodiments apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other tangible storage technology.

Figure 2A:
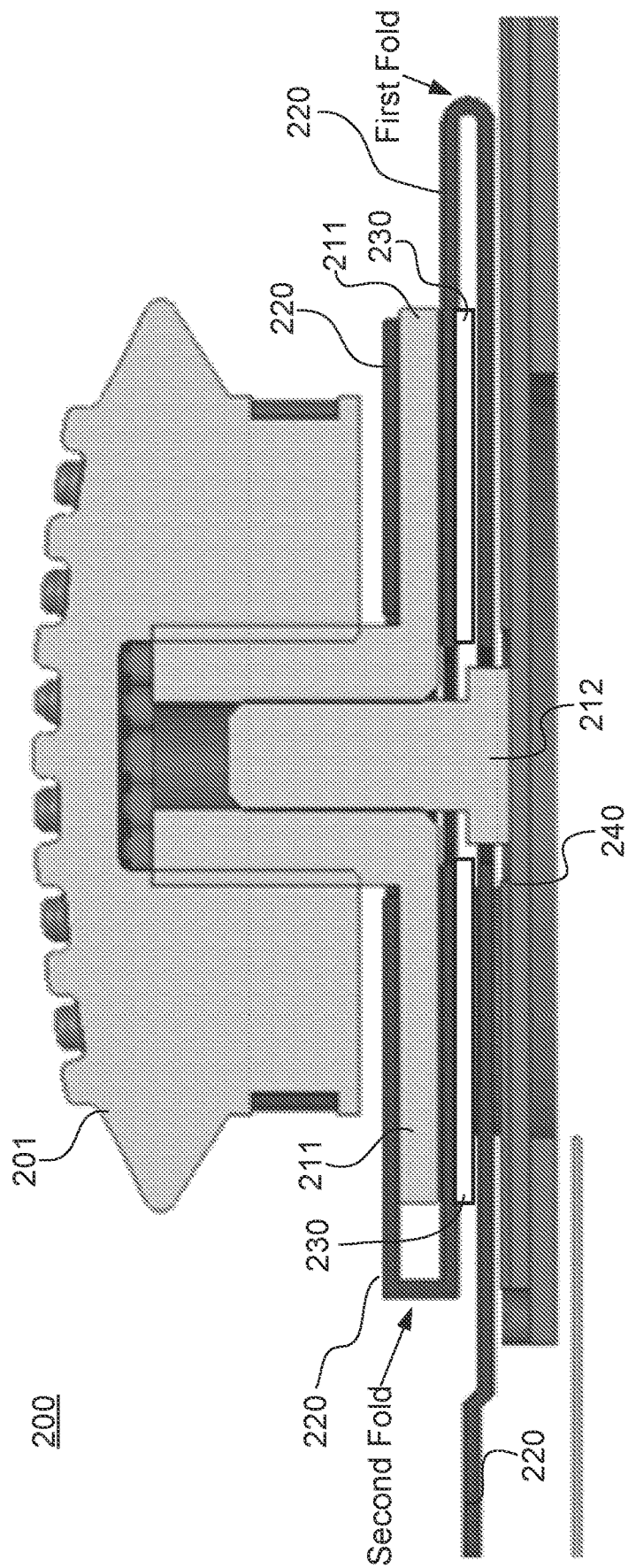
FIG. 2A depicts a side cross-sectional view of a pointing stick assembly according to an exemplary embodiment of the disclosure.
Figure 2B:
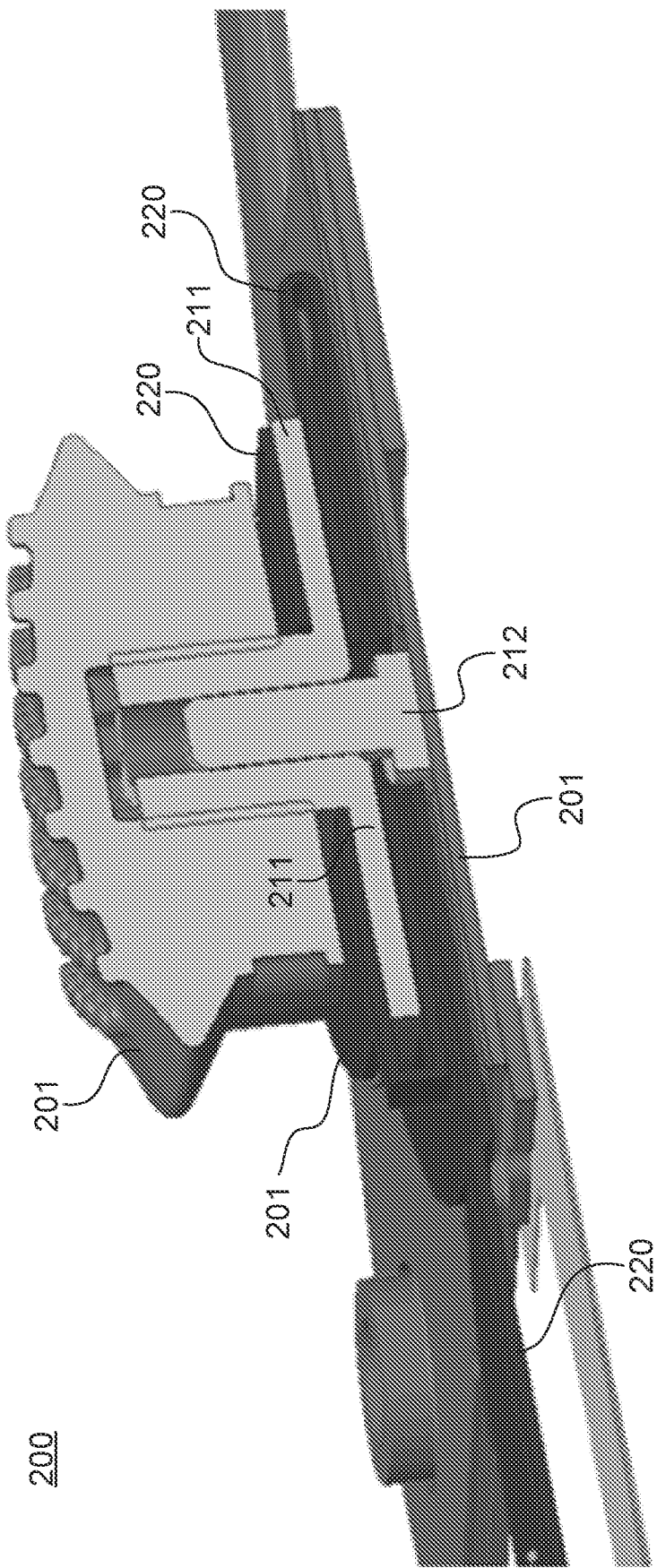
FIG. 2B depicts a perspective cross-sectional view of the pointing stick assembly depicted in FIG. 2A.
Figure 2C:
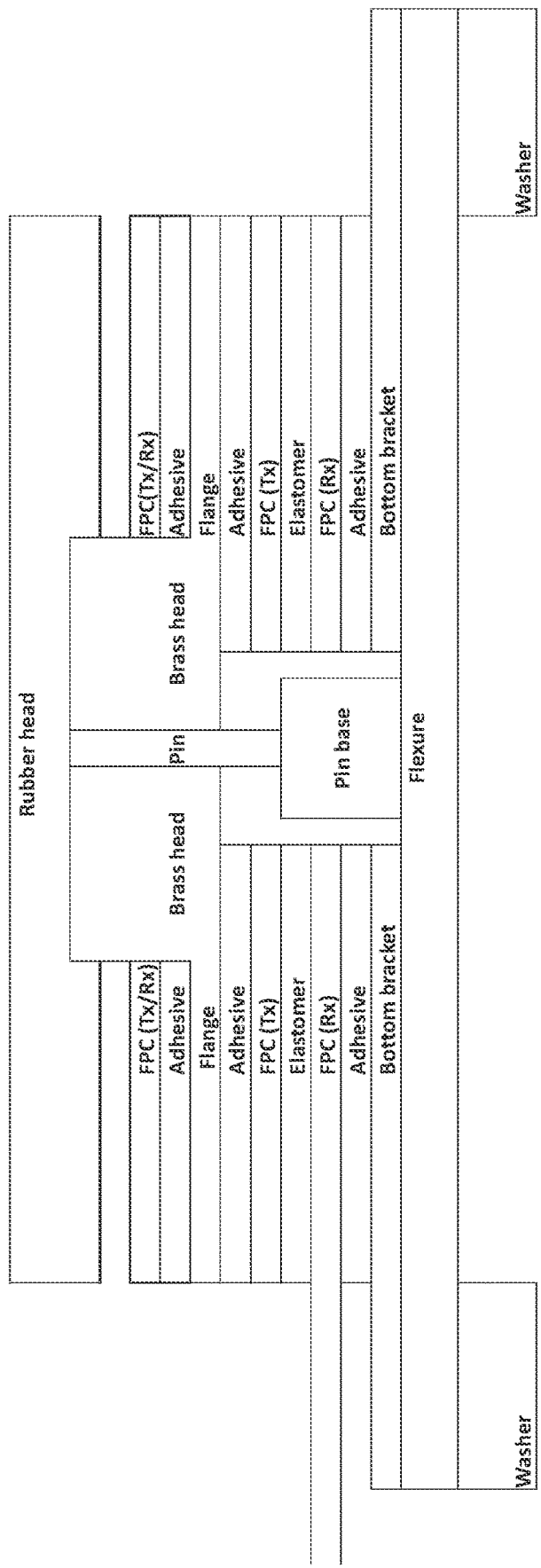
FIG. 2C depicts a block diagram corresponding to an exemplary implementation of the pointing stick assembly 200 depicted in FIGS. 2A-2B.

FIG. 2A depicts a side cross-sectional view of a pointing stick assembly 200 according to an exemplary embodiment of the disclosure, and FIG. 2B depicts a perspective cross-sectional view of the pointing stick assembly depicted in FIG. 2A. FIG. 2C depicts a block diagram corresponding to an exemplary implementation of the pointing stick assembly 200 depicted in FIGS. 2A-2B. The pointing stick assembly 200 includes a head (e.g., rubber head 201), a shaft (e.g., including an outer shaft 211 and an inner shaft 212, wherein the inner shaft 212 has a solid cylindrical part and the outer shaft 211 has a square shape with a hollow cylindrical part within which the solid cylindrical part of the inner shaft 212 is disposed (see also FIG. 4 for another view)), and a folded flexible printed circuit (FPC) 220 having transmitter and receiver electrodes with respective traces disposed thereon, wherein the respective traces connect the transmitter and receiver electrodes to a processing system. The outer shaft 211 may be a head (e.g., made of brass) having a flange (e.g., made of brass), and the inner shaft 212 may be a pin (e.g., made of stainless steel) having a pin base (e.g., made of stainless steel) as depicted in FIG. 2C. The FPC 220 may be folded twice, so as to form three FPC layers within the pointing stick assembly 200, wherein the top layer is disposed on top of the flange of the outer shaft 211, a middle layer of the FPC is disposed below the flange of the outer shaft 211 and on top of a spacer 230 (e.g., elastomer, such as a rubber elastomer), and the bottom layer of the FPC is disposed below the spacer 230 and on top of a support 240 of the pointing stick assembly 200. The support 240 may include a bottom bracket, a flexure, and a washer (to make space for elastic deformation), wherein each of the bottom bracket, the flexure, and the washer may be made of stainless steel, and wherein the flexure may be configured to deform when a downward pressing force and/or a tilting force is applied to the pointing stick assembly. As depicted in FIG. 2C, there may further be adhesive material between the middle layer of the FPC 220 and the flange of the outer shaft 211, between the top layer of the FPC 220 and the flange of the outer shaft 211, and between the bottom layer of the FPC 220 and the bottom bracket of the support 240.

Figure 3:
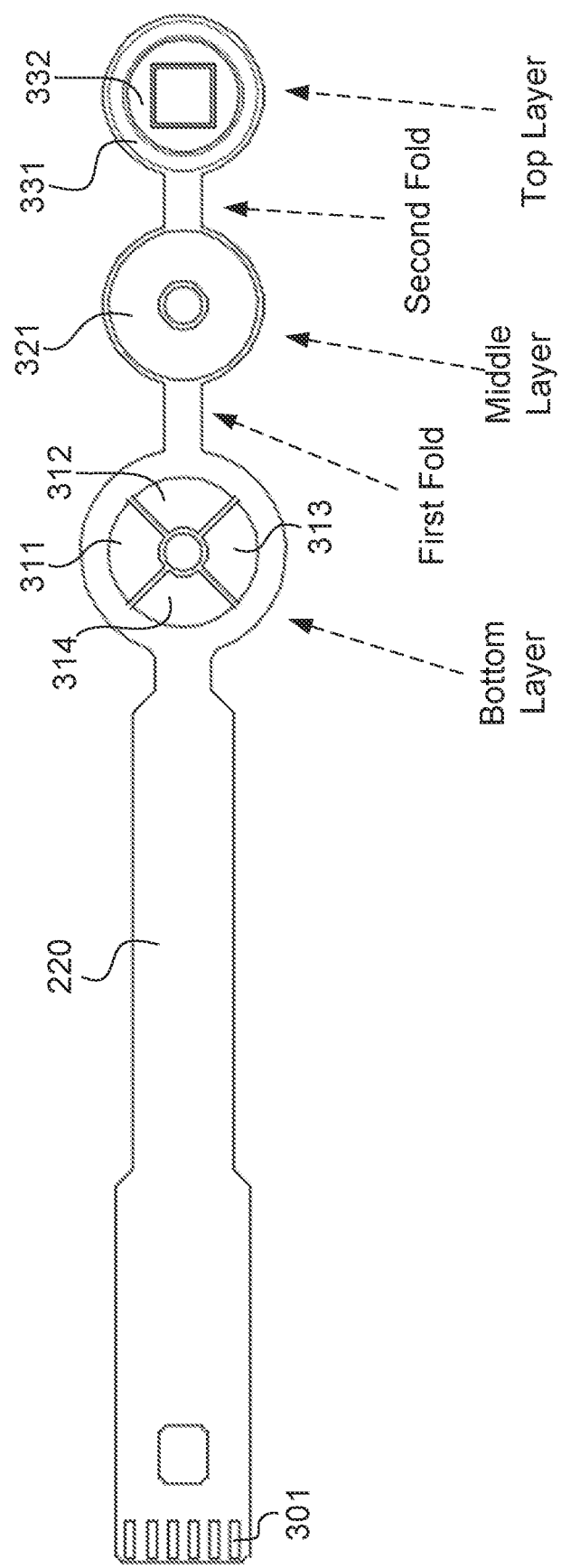
FIG. 3 depicts a top-down view of a flexible printed circuit (FPC) in unfolded form.

FIG. 3 depicts a top-down view of an FPC (e.g., the FPC 220 depicted in FIGS. 2A-2C) in unfolded form. In this example, the top layer of the FPC 220 includes a single receiver electrode 332 and a single transmitter electrode 331, the middle layer of the FPC 220 includes a single transmitter electrode 321 (which may be connected via a trace to the single transmitter electrode of the top layer, such that the transmitter electrodes of the top and middle layers operate as a single transmitter channel), and the bottom layer of the FPC 220 includes four receiver electrodes 311, 312, 313, 314 (each forming a respective receive channel separate from each other and from a receive channel corresponding to the receiver electrode 332 of the top layer). Each of the respective transmitter and receiver electrodes of the three layers of the FPC 220 are connected through respective traces disposed in the FPC 220 to a plurality of contacts 301 on the FPC 220, whereby the plurality of contacts 301 connect the FPC 220 to a processing system for driving the transmitter electrodes of the FPC 220 with sensing signals and for processing resulting signals received via the receiver electrodes of the FPC 220.

To assemble the pointing stick assembly 200, the hole in the bottom layer of the FPC 220 is fitted around the solid cylindrical part of the inner shaft 212. The spacer 230 and the middle layer of the FPC 220 also have a hole that fits around the solid cylindrical part of the inner shaft 212, such that the FPC 220, when folded at the "First Fold" depicted in FIGS. 2A and 3, has both the bottom and middle layers of the FPC 220 disposed around the solid cylindrical part of the inner shaft 212, with the spacer 230 between the bottom and middle layers of the FPC 220. The top layer of the FPC 220 has a hole that fits around the square shape of the outer shaft 211, such that the FPC 220, when further folded at the "Second Fold" depicted in FIGS. 2A and 3, has the top layer of the FPC 220 disposed around the square part of the outer shaft 211, with a round flange of the outer shaft 211 separating the middle and top layers of the FPC 220.

It will be appreciated that the electrode configurations of the respective FPC layers depicted in FIG. 3 is merely an example, and that other embodiments of the disclosure may include other electrode configurations. For example, the receiver electrode 332 and transmitter electrode 331 are not required to be an inner ring and an outer ring of the top layer, respectively, and may be swapped or may have other shapes. In another example, there may be more than one transmitter electrode provided in the middle layer. In yet another example, there may be more or less than four receiver electrodes provided in the bottom layer. In yet another example, the middle layer and bottom layer may be swapped.

Figure 4:
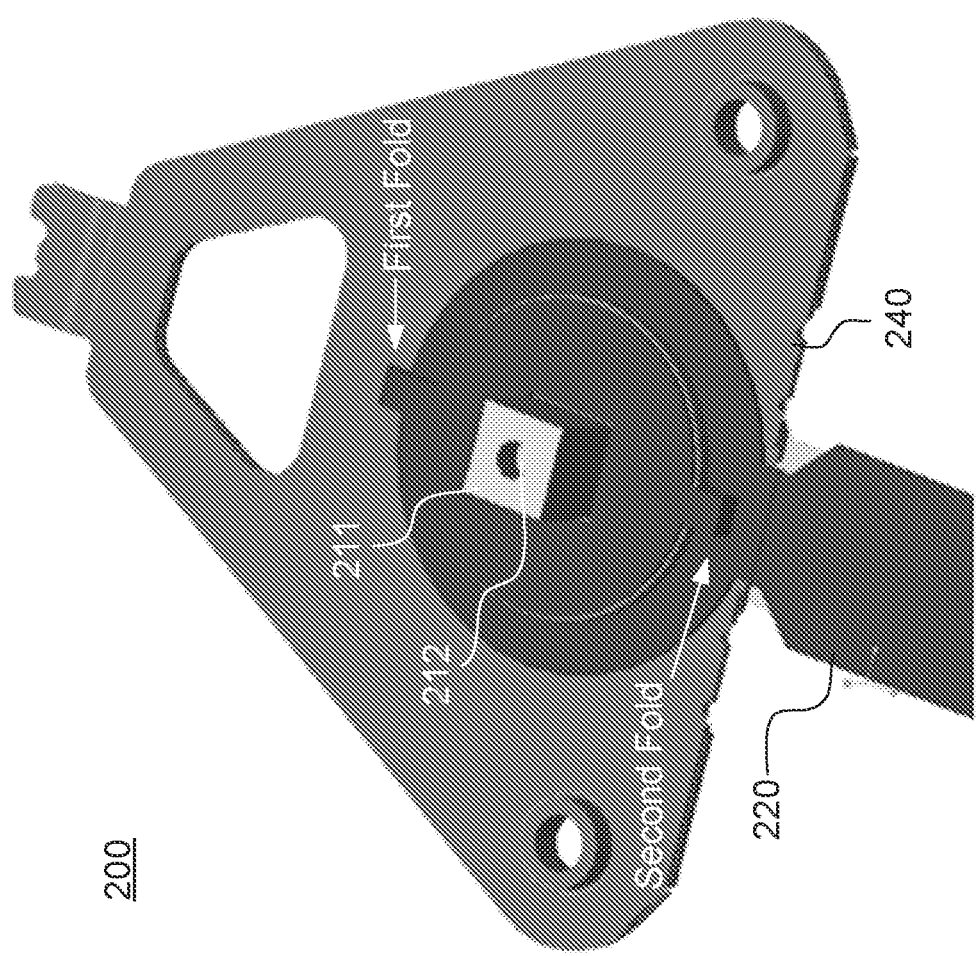
FIG. 4 depicts a perspective view of the pointing stick assembly depicted in FIGS. 2A-2C in a partially assembled form, without the head.

FIG. 4 depicts a perspective view of the pointing stick assembly 200 depicted in FIGS. 2A-2C in a partially assembled form, without the rubber head 201. As can be seen in FIG. 4, the top layer of the FPC 220 fits around the square outline of the outer shaft 211, and the outer shaft 211 has a hollow cylindrical portion in which a cylindrical part of the inner shaft 212 is disposed.

Figure 5A:
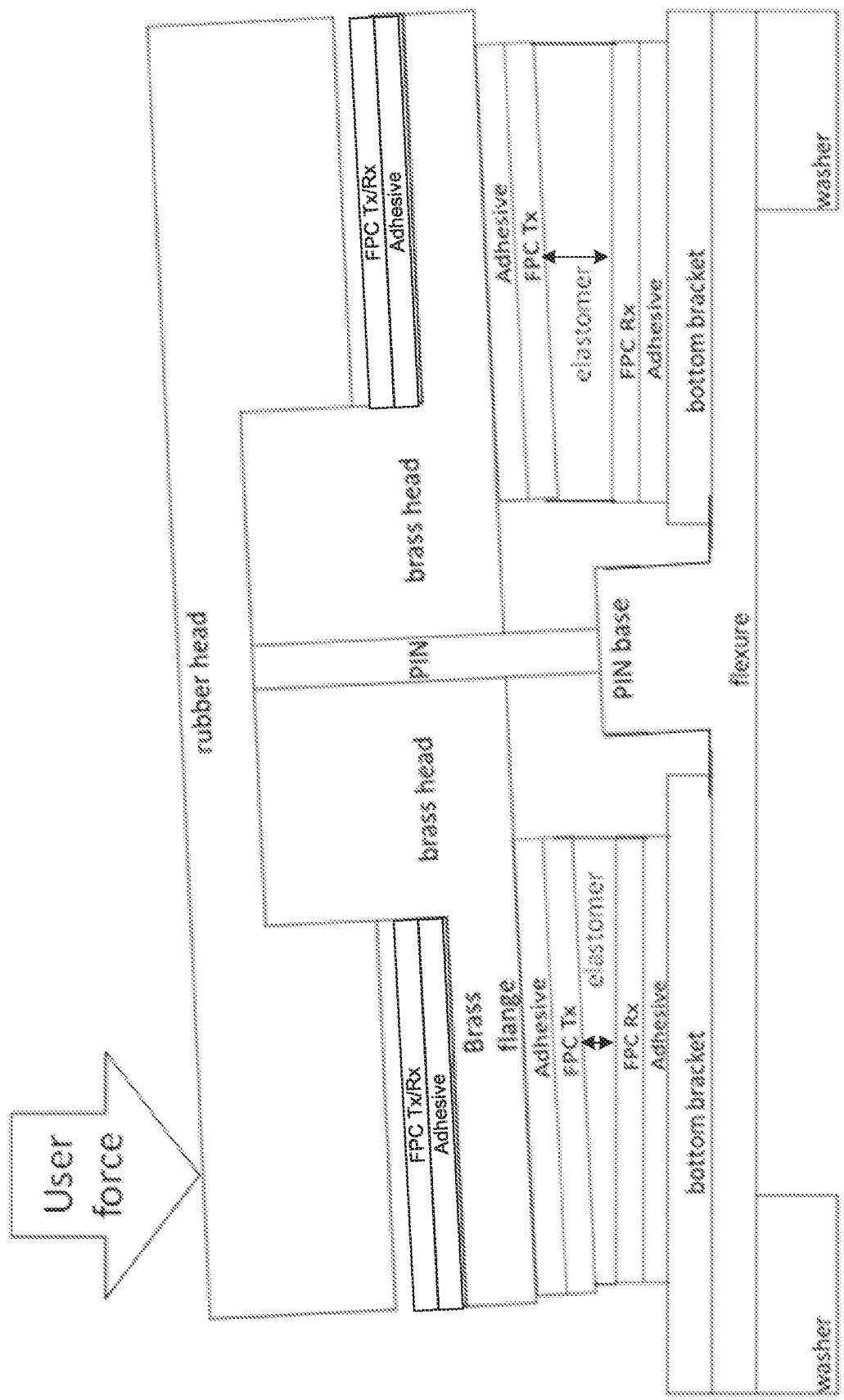
FIG. 5A is a schematic diagram showing a tilting force being applied to a pointing stick assembly according to an exemplary embodiment of the disclosure.

FIG. 5A is a schematic diagram showing a tilting force being applied to a pointing stick assembly according to an exemplary embodiment of the disclosure. As shown in FIG. 5A, the downward force of the user's finger tilting the head of the pointing stick assembly causes deformation of the elastomer, and a capacitive response corresponding to the deformation may be detected via the receiver electrodes in the bottom layer of the FPC based on changes in capacitance caused by changes in distances between respective receiver electrodes in the bottom layer of the FPC and the transmitter electrode in the middle layer of the FPC (as can be seen in FIG. 5A, the distance between the middle "FPC Tx" layer and the bottom "FPC Rx" layer decreases proximate to the location in which the user force is applied to tilt the pointing stick, and the distance between the middle "FPC Tx" layer and the bottom "FPC Rx" layer increases on the opposite side of the pointing stick assembly).

In one example, if the pressing force is straight downwards (i.e., pressing vertically downwards on the center of the head of the pointing stick assembly), a respective change in capacitance detected via each of the four receiver electrodes 311, 312, 313, 314 may be approximately equal, but in another example, if the pressing force corresponds to a tilt with a direction associated therewith (e.g., tilt towards receiver electrode 312), an increase in capacitance may be detected at one respective electrode (e.g., receiver electrode 312) and a decrease in capacitance may be detected via another receiver electrode (e.g., receiver electrode 314). It will be appreciated that these capacitive responses are based on the respective distances between the transmitter electrode of the middle FPC layer and the receiver electrodes of the bottom FPC layer, whereby different types of tilting or pressing actions correspond to different sets of capacitive responses being detected. There may also be cases where the user's finger is simultaneously pressing down on and tilting the pointing stick, in which case a stronger overall downward force may be detected on the receiver electrodes (relative to tilting without pressing down), while the relative strengths of the capacitive responses on the receiver electrodes relative to one another still indicate a direction of tilt. Thus, the processing system is able to use resulting signals obtained via the four receiver electrodes 311, 312, 313, 314 to determine whether a user is pressing down on the pointing stick (e.g., based on one or more of or a sum of the resulting signals obtained via the four receiver electrodes 311, 312, 313, 314 being greater than a first threshold) and/or whether the pointing stick is being tilted in a particular direction (e.g., based on relative strengths of the resulting signals obtained via two or more of the four receiver electrodes 311, 312, 313, 314).

It will be appreciated that the flexure shown in FIG. 5A, which may be made of stainless steel, may also deform as a result of the user force on the rubber head.

Figure 5B:
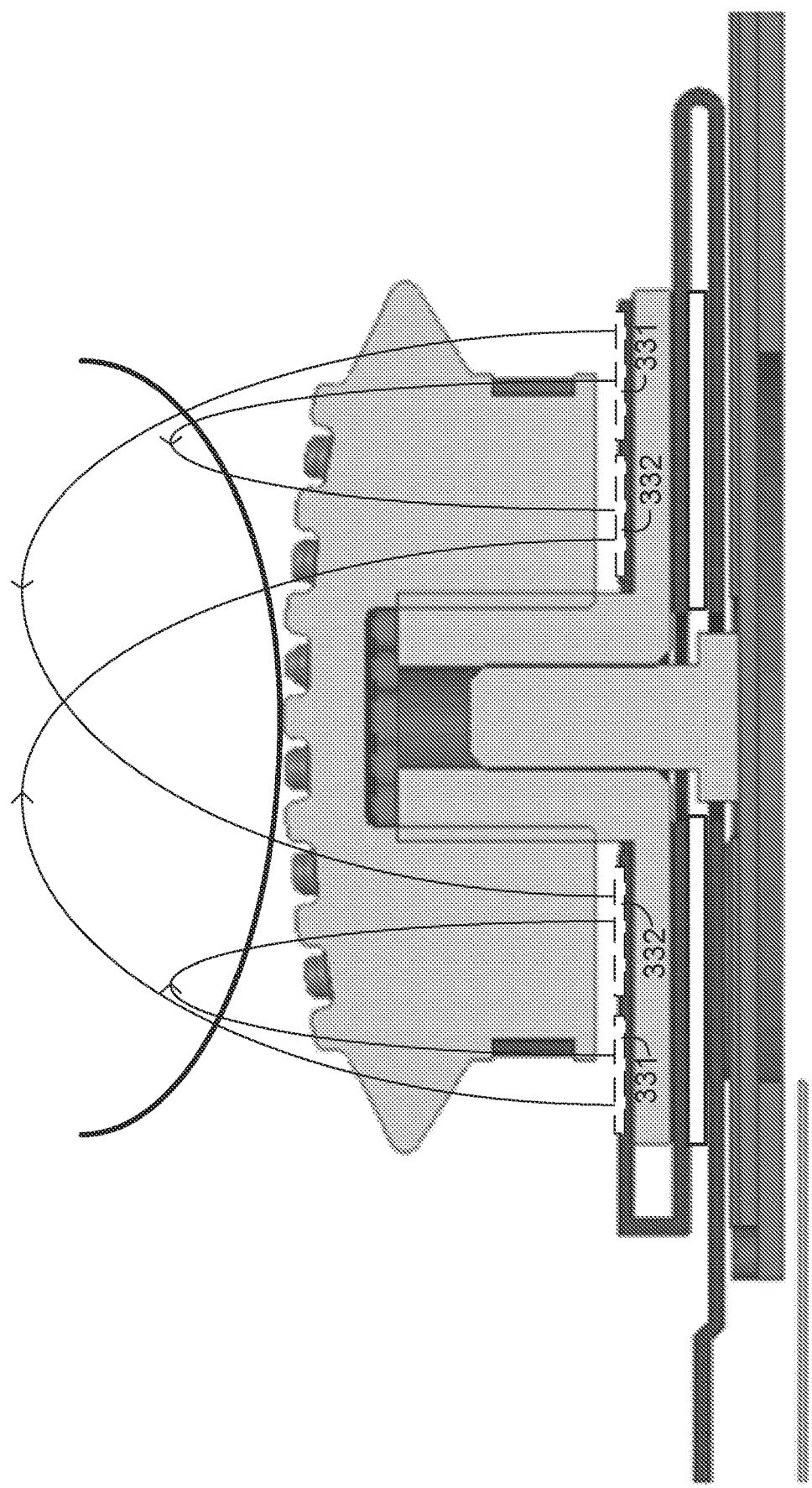
FIG. 5B is a schematic diagram showing a finger being present without applying a force (or applying only a very light force) on a pointing stick assembly according to an exemplary embodiment of the disclosure.

FIG. 5B is a schematic diagram showing a finger being present without applying a force (or applying only a very light force) on a pointing stick assembly according to an exemplary embodiment of the disclosure. As shown in FIG. 5B, the presence of the user's finger on the head of the pointing stick assembly, even if present with no downward force and/or tilt or only a very light downward force and/or tilt, affects the electric field between a transmitter electrode 331 (configured as an outside ring) and a receiver electrode 332 (configured as an inside ring) on the top layer of the FPC 220 and thereby causes a change in the capacitance. Thus, based on resulting signals obtained via the receiver electrode 332 of the top layer, the processing system is able to determine whether or not a finger is present on the pointing stick (e.g., based on a change of capacitance caused by the presence of the finger being greater than a second threshold).

In view of the foregoing, it will be appreciated that FPC 220 can be thought of as including two different capacitive sensors—for example, a first capacitive sensor comprised of the transmitter and receiver electrodes in the middle and bottom layers for detecting navigational inputs on the pointing stick (e.g., downward presses and/or directional tilting), and a second capacitive sensor comprised of the transmitter and receiver electrodes in the top layer for detecting presence of a finger on the pointing stick. It will further be appreciated that the two capacitive sensors have different working principles in that the first capacitive sensor detects changes in capacitance due to distance change(s) between the middle and bottom layers of the FPC 220 (and thus these electrodes do not need to be close to the finger), whereas the second capacitive sensor detects a change in capacitance caused by the presence of the finger (and thus it is advantageous for the electrodes of the second capacitive sensor to be closer to the finger, which is why they are disposed on the top layer of the FPC 220). In an exemplary implementation, the distance between the top of the pointing stick to the top layer of the FPC 220 may be around 3 mm, so the second capacitive sensor is configured to be sensitive enough to detect the presence of a finger at that distance.

It will be appreciated that the embodiments depicted in FIGS. 2A-5B are merely illustrative examples of implementations of the present disclosure, and that other embodiments may be implemented without departing from the principles of the present disclosure. For example, instead of having a two-part shaft with a cylindrical inner shaft and a square-shaped outer shaft, other types and shapes of shafts may be used. To provide another example, different electrode configurations other than those discussed above may also be used, such as having more or less than four receiver electrodes for detection of navigation inputs via the pointing stick, or having separate transmit channels for the transmitter electrodes in the top and middle layers of the FPC, or having more than one transmitter electrode in the top layer and/or the middle layer, or having more than one receiver electrode in the top layer, or switching the middle layer with the bottom layer such that the receiver electrodes for detection of navigation inputs are disposed in the middle layer and the transmitter electrode which is driven for detection of navigation inputs is disposed in the bottom layer. To provide yet another example, instead of using a single FPC with two folds, multiple FPCs or multiple rigid printed circuits may be utilized, wherein respective printed circuit layers are connected through wires, vias, or other types of connections. In yet another example, the top printed circuit layer, which is used for presence detection, may be connected to a processing system via a separate set of connections relative to the bottom two printed circuit layers, which are used for tilt/press navigation detection.

Figure 6:
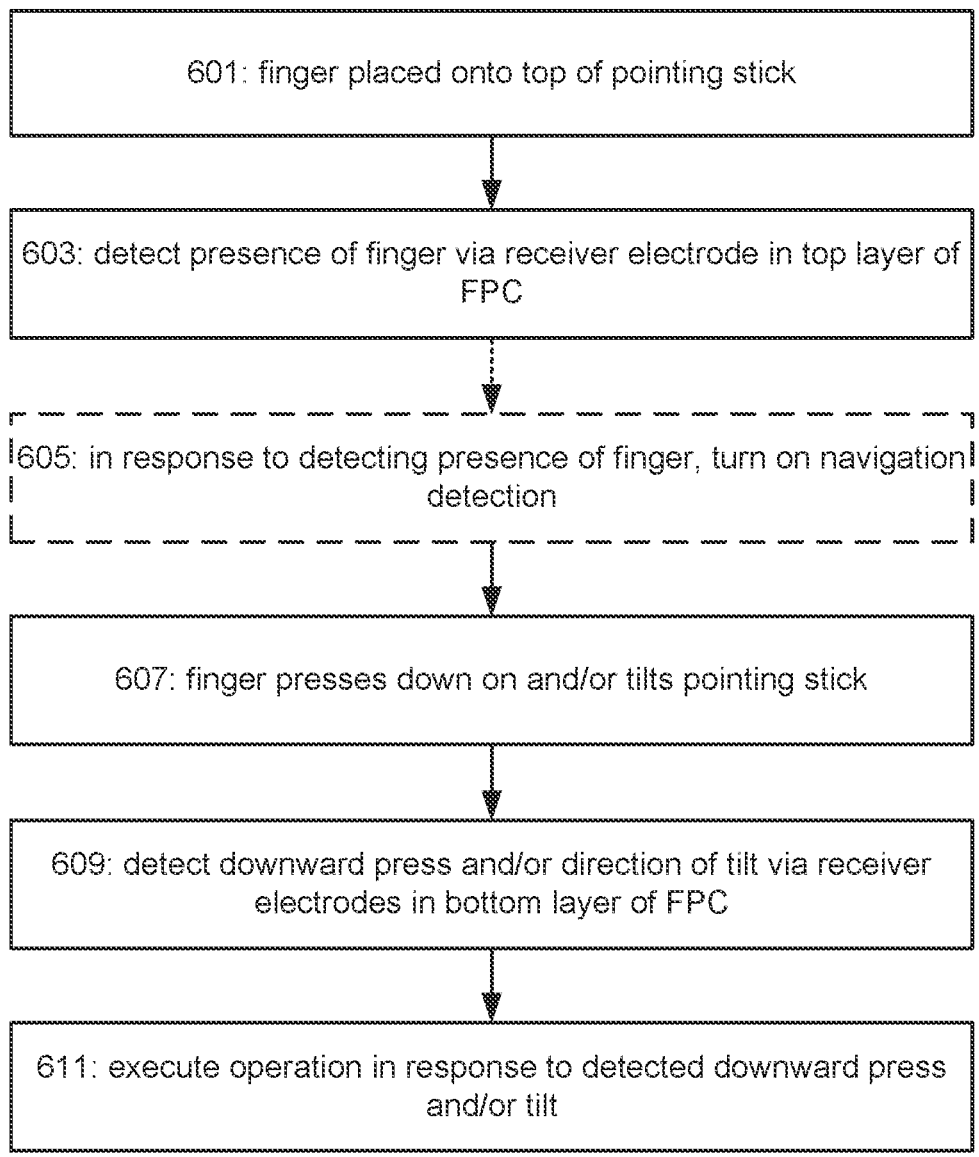
FIG. 6 depicts a flowchart illustrating an exemplary process for using a pointing stick assembly according to an exemplary embodiment of the disclosure for presence detection and navigation detection.

FIG. 6 depicts a flowchart illustrating an exemplary process for using a pointing stick assembly according to an exemplary embodiment of the disclosure for presence detection and navigation detection. At stage 601, a finger is placed onto the top of the pointing stick, and at stage 603, the presence of the finger is detected via a receiver electrode in the top layer of the FPC of the pointing stick assembly (e.g., based on a processing system detecting a change of capacitance corresponding to the presence of the finger based on resulting signals obtained via the receiver electrode in the top layer of the FPC, wherein the resulting signals are obtained responsive to first sensing signals driven onto a transmitter electrode in the top layer of the FPC). At stage 607, the finger then presses down on and/or tilts the pointing stick, and at stage 609, the downward press and/or direction of tilt is detected via receiver electrodes in the bottom layer of the FPC (e.g., based on a processing system detecting capacitive responses corresponding to the downward press and/or direction of tilt based on resulting signals obtained via the receiver electrodes in the bottom layer of the FPC, wherein the resulting signals are obtained responsive to second sensing signals driven onto a transmitter electrode in the middle layer of the FPC).

At stage 611, an operation is executed by the processing system in response to the detected downward press and/or direction of tilt. For example, for a pointing stick that is part of a laptop computer, a downward press may be registered as a user action similar to a mouse click, such that the laptop computer responds to the downward press similar to a computer responding to a mouse click. To provide another example, tilting of the pointing stick may be interpreted similarly as movement of a mouse in the direction of tilt, such that a computer may response to a tilt similar to a corresponding mouse movement (e.g., by displaying movement of a mouse cursor on a screen). To provide yet another example, a combined pressing and tilting action on the pointing stick may be interpreted similarly as a click-and-drag mouse operation for a computer, such that a computer may response to a press-and-tilt operation on the pointing stick similarly to a click-and-drag mouse operation (e.g., by creating a selection box or highlighting text in accordance with the press-and-tilt operation).

In certain exemplary embodiments, stage 605 may optionally be included, wherein stage 605 provides for turning on navigation detection (e.g., for detection of pressing and/or tilting operations performed on the pointing stick) in response to first detecting the presence of the finger on the pointing stick. As such, navigation detection can advantageously be turned off while a finger is not present, and the navigation detection functionality associated with the pointing stick may be woken up in response to a finger being detected on top of the pointing stick. This may help to avoid issues of pointing stick drift (since stick-based navigation is off while the finger is not present), and may also help to reduce power consumption.

It will be appreciated that presence detection may be performed by a processing system using the top layer of the FPC in an intermittent or continuous manner. It will further be appreciated that presence detection may continue while the finger is pressing down on and/or tilting the pointing stick to verify that the finger is still present while the navigation-related operations are being performed and that the detected inputs are not due to detection errors (such as in the case of pointing stick drift).

Figure 7:
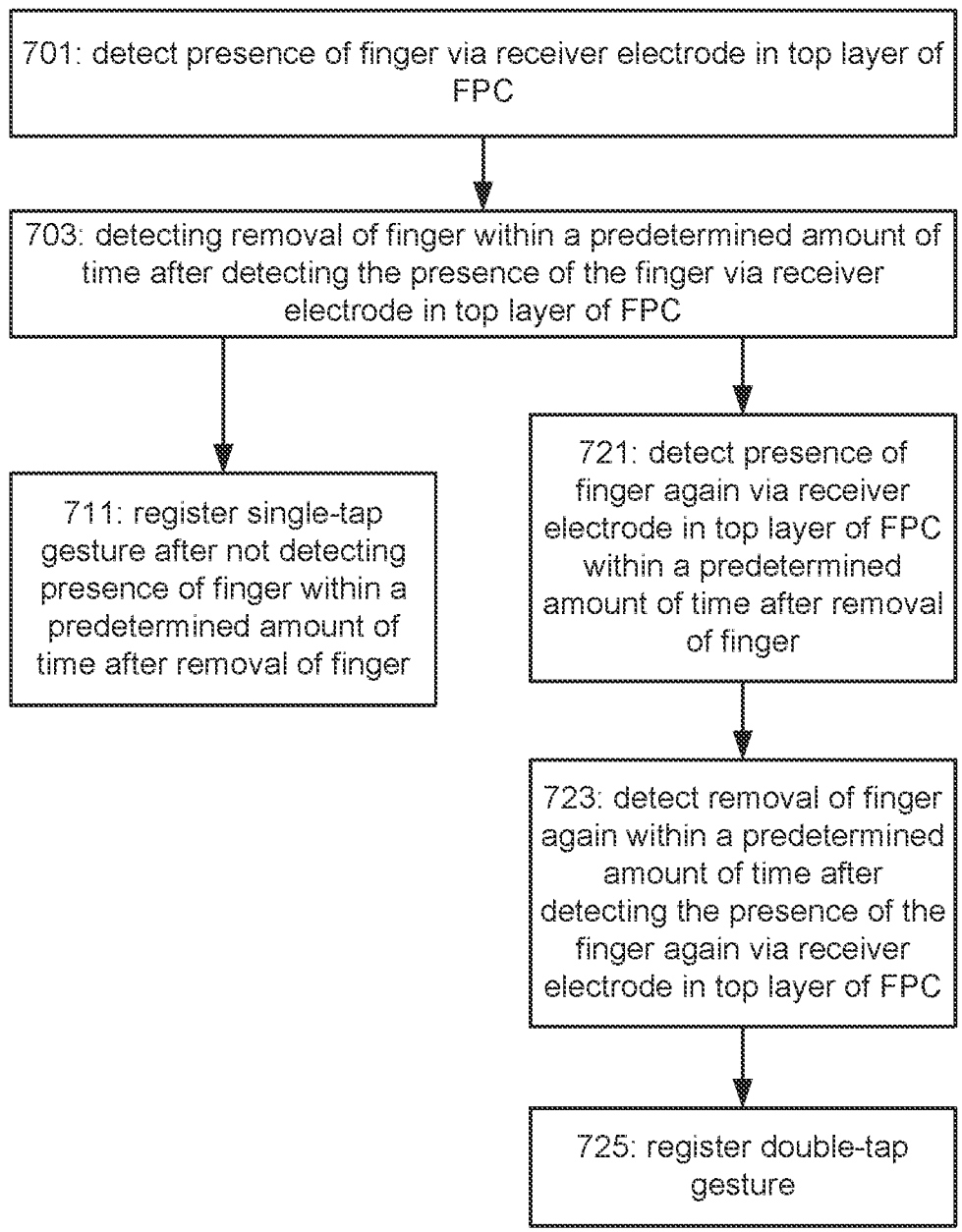
FIG. 7 depicts a flowchart illustrating an exemplary process for using a pointing stick assembly according to an exemplary embodiment of the disclosure for detecting tapping gestures.

FIG. 7 depicts a flowchart illustrating an exemplary process for using a pointing stick assembly according to an exemplary embodiment of the disclosure for detecting tapping gestures. At stage 701, the presence of a finger may be detected via a receiver electrode in the top layer of the FPC of the pointing stick assembly, and at stage 703, removal of the finger is detected via the same electrode within a predetermined amount of time after having detected the presence of the finger, wherein the predetermined amount of time is a short time interval corresponding to a user tapping a finger onto the top of the pointing stick once.

In the case of a single-tap—i.e., when a tap is not followed up with a second tap—stage 711 may be performed. At stage 711, a single-tap gesture may be registered by the processing system based on not detecting the presence of the finger again within a predetermined amount of time after removal of the finger at stage 703.

In the case of a double-tap—i.e., when a first tap is followed up with a second tap within a certain (typically short) amount of time—stages 721, 723 and 725 may be performed. At stage 721, the presence of the finger is detected again by the receiver electrode in the top layer within a predetermined amount of time after the removal of the finger at stage 703, and at stage 723, removal of the finger a second time is detected within a predetermined amount of time after having detected the presence of the finger again at stage 721. At stage 725, the processing system registers a double-tap gesture in response to having detected the second removal at stage 723.

In view of the process of FIG. 7, it will be appreciated that a pointing stick assembly according to exemplary embodiments of the disclosure provides for additional types of gestures to be detected relative to conventional pointing sticks. For example, in addition to simply detecting downward presses and/or tilts, the pointing stick assembly according to exemplary embodiments of the disclosure is further able to detect at least single-taps and double-taps on the pointing stick where the user lightly touches the pointing stick without forcibly pressing down on the pointing stick.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the disclosure (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

Exemplary embodiments are described herein. Variations of those exemplary embodiments may become apparent to those of ordinary skill in the art upon reading the foregoing description. The inventors expect skilled artisans to employ such variations as appropriate, and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

The invention claimed is:

1. A system, comprising:
   a pointing stick assembly, comprising:
      a head having a top surface configured to interface with a finger; and
      a first sensor layer comprising a receiver electrode and a transmitter electrode, wherein the first sensor layer is disposed directly beneath the head without any other layers of the pointing stick assembly between the head and the first sensor layer;

a second sensor layer comprising a transmitter electrode; and
a third sensor layer comprising a plurality of receiver electrodes; and
a processing system coupled to the pointing stick assembly, wherein the processing system is configured to:
drive the transmitter electrode of the first sensor layer of the pointing stick assembly with first sensing signals for presence detection;
determine whether or not a finger is present on the top surface of the pointing stick assembly based on first resulting signals obtained via the receiver electrode of the first sensor layer of the pointing stick assembly in response to the first sensing signals; and
drive the transmitter electrode of the second sensor layer with second sensing signals for navigation detection;
wherein the first sensor layer of the pointing stick assembly is closer to the top surface of the pointing stick assembly than the second and third sensor layers of the pointing stick assembly.

2. The system according to claim 1, wherein the receiver electrode and the transmitter electrode of the first sensor layer are formed as concentric rings.

3. The system according to claim 1, wherein the processing system is further configured to turn on the navigation detection in response to detecting that a finger is present on the top surface of the pointing stick assembly and to turn off the navigation detection in response to detecting that a finger is not present on the top surface of the pointing stick assembly.

4. The system according to claim 1, wherein the processing system is further configured to detect a pressing operation and/or a tilting operation performed on the pointing stick assembly by a finger based on second resulting signals obtained via the plurality of receiver electrodes of the third sensor layer of the pointing stick assembly in response to the second sensing signals.

5. The system according to claim 1, wherein the processing system is further configured to register a single tap or a double tap gesture based on the first resulting signals obtained via the receiver electrode of the first sensor layer of the pointing stick assembly.

6. The system according to claim 1, wherein the transmitter electrode of the first sensor layer is connected to the transmitter electrode of the second sensor layer, and the processing system is configured to drive the transmitter electrode of the first sensor layer and the transmitter electrode of the second sensor layer together as a single transmitter channel.

7. The system according to claim 1, wherein the third sensor layer comprises at least four receiver electrodes.

8. The system according to claim 1, wherein the second sensor layer and the third sensor layer are part of a single flexible printed circuit (FPC), and wherein the FPC comprises a fold between the second sensor layer and the third sensor layer.

9. The system according to claim 1, wherein the first sensor layer and the second sensor layer are part of a single flexible printed circuit (FPC), and wherein the FPC comprises a fold between the first sensor layer and the second sensor layer.

10. The system according to claim 1, wherein one or more of the first, second and third sensor layers are formed as rigid printed circuit layers.

11. The system according to claim 1, wherein each of the first, second and third sensor layers are formed as rigid printed circuit layers.

12. A pointing stick assembly, comprising:
a head having a top surface configured to interface with a finger;
a shaft connected to the head, wherein the shaft is configured to be moved downward based on a finger pressing down on the head and to be tilted based on a finger tilting the head;
a first sensor layer comprising a receiver electrode and a transmitter electrode, wherein the first sensor layer is disposed directly beneath the head without any other layers of the pointing stick assembly between the head and the first sensor layer;
a second sensor layer comprising a transmitter electrode; and
a third sensor layer comprising a plurality of receiver electrodes;
wherein the first sensor layer is configured for detection of presence of a finger based on a change in capacitance between the receiver electrode and the transmitter electrode of the first sensor layer caused by the presence of the finger on the top surface of the head; and
wherein the second and third sensor layers are configured for detection of pressing and tilting operations performed on the head based on changes in capacitance between the transmitter electrode of the second sensor layer and the plurality of receiver electrodes of the third sensor layer caused by corresponding changes in distance between the transmitter electrode of the second sensor layer and the plurality of receiver electrodes of the third sensor layer.

13. The pointing stick assembly according to claim 12, wherein the receiver electrode and the transmitter electrode of the first sensor layer are formed as concentric rings.

14. The pointing stick assembly according to claim 12, wherein the transmitter electrode of the first sensor layer is connected to the transmitter electrode of the second sensor layer.

15. The pointing stick assembly according to claim 12, wherein the third sensor layer comprises at least four receiver electrodes.

16. The pointing stick assembly according to claim 12, wherein the second sensor layer and the third sensor layer are part of a single flexible printed circuit (FPC), and wherein the FPC comprises a fold between the second sensor layer and the third sensor layer.

17. The pointing stick assembly according to claim 12, wherein the first sensor layer and the second sensor layer are part of a single flexible printed circuit (FPC), and wherein the FPC comprises a fold between the first sensor layer and the second sensor layer.

18. The pointing stick assembly according to claim 12, wherein one or more of the first, second and third sensor layers are formed as rigid printed circuit layers.

19. The pointing stick assembly according to claim 12, wherein each of the first, second and third sensor layers are formed as rigid printed circuit layers.

20. A method for operating a pointing stick assembly, comprising:
driving, by a processing system, a transmitter electrode of a first sensor layer of the pointing stick assembly;
obtaining, by the processing system, first resulting signals via a receiver electrode of the first sensor layer of the pointing stick assembly based on driving the transmitter electrode of the first sensor layer of the pointing stick assembly, wherein the first sensor layer is disposed directly beneath a head of the pointing stick assembly without any other layers of the pointing stick assembly between the head and the first sensor layer;

detecting, by the processing system, based on the first resulting signals, that a finger is present on the pointing stick assembly;

driving, by the processing system, a transmitter electrode of a second sensor layer of the pointing stick assembly;

obtaining, by the processing system, second resulting signals via a plurality of receiver electrodes of a third sensor layer of the pointing stick assembly based on driving the transmitter electrode of the second sensor layer of the pointing stick assembly; and detecting, by the processing system, based on the second resulting signals, a pressing operation and/or a tilting operation performed on the pointing stick assembly by the finger.

* * * * *